(12) United States Patent
Song et al.

(10) Patent No.: US 9,766,274 B2
(45) Date of Patent: Sep. 19, 2017

(54) CURRENT SAMPLING CIRCUIT AND METHOD

(71) Applicant: Sanechips Technology Co., Ltd., Shenzen, Guangdong (CN)

(72) Inventors: Xiaozhen Song, Shenzhen (CN); Jie Hu, Shenzhen (CN); Yongbo Zhang, Shenzhen (CN)

(73) Assignee: Sanechips Technology Co., Ltd., Shenzhen, Guangdong (CN)

( * ) Notice: Subject to any disclaimer, the term of this patent is extended or adjusted under 35 U.S.C. 154(b) by 90 days.

(21) Appl. No.: 14/773,758

(22) PCT Filed: Nov. 10, 2014

(86) PCT No.: PCT/CN2014/090733
§ 371 (c)(1),
(2) Date: Sep. 9, 2015

(87) PCT Pub. No.: WO2015/149521
PCT Pub. Date: Oct. 8, 2015

(65) Prior Publication Data
US 2016/0109487 A1    Apr. 21, 2016

(30) Foreign Application Priority Data

Apr. 3, 2014  (CN) .......................... 2014 1 0134447

(51) Int. Cl.
*G06G 7/186* (2006.01)
*H03K 17/687* (2006.01)
*G01R 19/00* (2006.01)

(52) U.S. Cl.
CPC ..... *G01R 19/0038* (2013.01); *G01R 19/0092* (2013.01); *H03K 17/687* (2013.01)

(58) Field of Classification Search
CPC ............ G01R 19/0038; G01R 19/0092; H03K 17/687
(Continued)

(56) References Cited

U.S. PATENT DOCUMENTS 4,464,591 A    8/1984  Rapp
4,710,726 A *  12/1987 Czarnul .................. G06G 7/14
                                                    327/328
(Continued)

FOREIGN PATENT DOCUMENTS

CN          1076564 A      9/1993
CN        101821852 A      9/2010
(Continued)

OTHER PUBLICATIONS

Supplementary European Search Report in European application No. 14885839.2, mailed on Jun. 20, 2016.
(Continued)

*Primary Examiner* — Brandon S Cole
(74) *Attorney, Agent, or Firm* — Oppedahl Patent Law Firm LLC (57) ABSTRACT

Disclosed is a current sampling circuit including a proportional current output circuit and a full differential common mode negative feedback circuit, specifically the proportional current output circuit is configured to calculate a current output from a power device according to a preset proportion to obtain a first proportional current and a second proportional current, and to output the first proportional current and the second proportional current to the full differential common mode negative feedback circuit; and the full differential common mode negative feedback circuit is configured to shunt respectively the first proportional current and the second proportional current using a full differential common mode negative feedback network with a bias current in
(Continued)

microamps to obtain a first sampling current and a second sampling current, and to output constantly the first sampling current and the second sampling current. Further disclosed is a current sampling method.

3 Claims, 4 Drawing Sheets

(58) Field of Classification Search
USPC ...... 327/91–96, 334, 337, 554; 341/122–125
See application file for complete search history.

(56) References Cited

U.S. PATENT DOCUMENTS

| | | | | |
|---|---|---|---|---|
| 4,918,338 | A * | 4/1990 | Wong | H03F 1/56 327/345 |
| 5,374,857 | A | 12/1994 | Carobolante | |
| 5,508,570 | A * | 4/1996 | Laber | G06G 7/186 327/553 |
| 5,585,746 | A | 12/1996 | Franke | |
| 5,815,012 | A * | 9/1998 | Rivoir | G05F 1/561 327/103 |
| 5,994,996 | A * | 11/1999 | Van Den Broek | H01C 17/06553 252/521.3 |
| 6,566,949 | B1 * | 5/2003 | Park | H03F 3/45179 330/252 |
| 7,164,317 | B1 | 1/2007 | Lorenz | |
| 7,960,997 | B2 | 6/2011 | Williams | |
| 8,749,222 | B2 | 6/2014 | Williams | |
| 8,786,359 | B2 * | 7/2014 | Bhuiyan | G05F 3/26 323/317 |
| 2003/0218482 | A1 * | 11/2003 | Ivanov | H03F 3/3028 327/134 |
| 2006/0012432 | A1 * | 1/2006 | Point | H03F 3/45183 330/258 |
| 2006/0255854 | A1 * | 11/2006 | Ahuja | G05F 3/30 327/541 |
| 2007/0115741 | A1 | 5/2007 | Jung | |
| 2008/0074189 | A1 | 3/2008 | Singh | |
| 2008/0106330 | A1 * | 5/2008 | Yoshida | H03F 3/387 330/10 |
| 2008/0315949 | A1 | 12/2008 | Douglas | |
| 2009/0039869 | A1 | 2/2009 | Williams | |
| 2009/0201051 | A1 * | 8/2009 | Ono | G11C 27/026 327/96 |
| 2011/0221421 | A1 | 9/2011 | Williams | |
| 2011/0248702 | A1 | 10/2011 | Kume | |
| 2012/0062240 | A1 | 3/2012 | Nishijima | |
| 2014/0021979 | A1 | 1/2014 | Huang | |
| 2014/0285178 | A1 | 9/2014 | Williams | |

FOREIGN PATENT DOCUMENTS

| | | |
|---|---|---|
| CN | 202374224 U | 8/2012 |
| CN | 202794314 U | 3/2013 |
| CN | 103558445 A | 2/2014 |

OTHER PUBLICATIONS

Chutham Sawigun eT al : "A 24nW, 0.65" V, 74-dB SNDR, 83-dB DR, class-AB current-mode sample and hold circuit",IEEE International Symposium on Circuits and Systems. ISCAS May 30, 2010-Jun. 2, 2010—Paris, France,iEEE, US, May 30, 2010 (May 30, 2010), pp. 3132-3135,XP031725191,ISBN:978-1-4244-5308-5.

Xiaoyun Hu eT al : "A Switched Current Sample-and-Hold Circuit",IEEE Journal of Solid-State Circuits, IEEE Service Center, Piscataway, NJ, USA,vol. 32, No. 6, Jun. 1, 1997 (Jun. 1, 1997 ), XP011060487,ISSN: 0018-9200.

International Search Report in international application No. PCT/CN2014/090733, mailed on Feb. 10, 2015.

English Translation of the Written Opinion of the International Search Authority in international application No. PCT/CN2014/090733, mailed on Feb. 10, 2015.

* cited by examiner

A current output from a power device is calculated according to a preset proportion to obtain a first proportional current and a second proportional current —— S601

The first proportional current and the second proportional current are shunted respectively using a full differential common mode negative feedback network and a bias current in microamps to obtain a first sampling current and a second sampling current, and the first sampling current and the second sampling current are output constantly —— S602

CURRENT SAMPLING CIRCUIT AND METHOD

TECHNICAL FIELD

The present disclosure relates to current sampling techniques in the field of circuit design, and in particular to a current sampling circuit and method.

BACKGROUND

Figure 1:
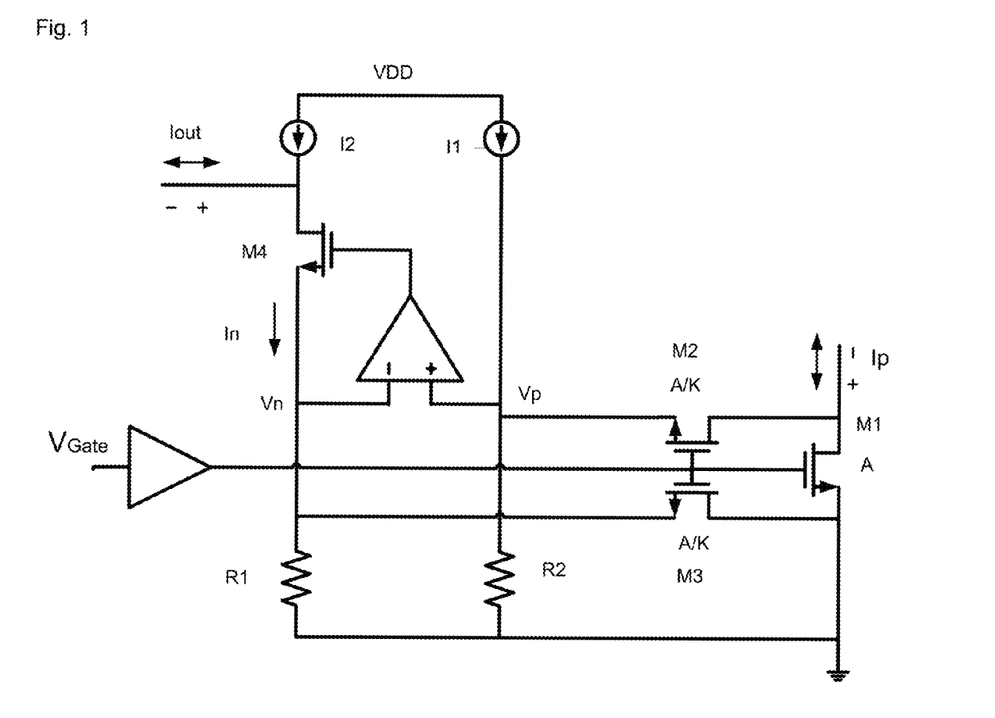
FIG. 1 is a schematic structural diagram of a current sampling circuit in related arts of an embodiment of the disclosure.

In related arts, implementation of a highly accurate current sampling circuit is as shown in FIG. 1, the current sampling circuit includes a power transistor M1, sampling transistors M2 and M3, and a close loop negative feedback circuit consisting of an operational amplifier, a transistor M4 and resistors R1, R2; wherein R1=R2, I1 and I2 are bias currents providing a quiescent operating point of the close loop negative feedback circuit, and the gain of the close loop negative feedback circuit is:

$$A_{feedback} = A_{op} \cdot g_{m4} R_o$$

In the current sampling circuit as shown in FIG. 1, the current in the power transistor M1 is firstly mirrored into the sampling transistors M2 and M3, after passing through the close loop negative feedback circuit consisting of the operational amplifier, the transistor M4 and the resistors R1 and R2, the mirrored current is output as a sampling current. In the above current sampling circuit, the clamping effect of the operational amplifier is used to ensure that a first input voltage $V_n$ is equal to a second input voltage $V_p$ so that the output sampling current $I_{out}$ is the same as the current flowing through the sampling transistors M2 and M3, thereby the current in the power transistor M1 can be sampled stably and accurately; if the current in the power transistor M1 changes direction, the output sampling current also changes direction, thereby implementing accurate sampling of current in both directions.

The current sampling scheme in the related arts has the following disadvantages: 1) it is disadvantageous for applications in large-scale circuits having a high integration density; 2) the current sampling circuit is not energy-saving due to its high power consumption.

SUMMARY

Embodiments of the disclosure are intended to provide a current sampling circuit that has an integrated circuit structure, a low power consumption and a low cost and can output a stable and accurate sampling current, and a corresponding current sampling method.

The technical solutions of the disclosure are implemented as follows.

An embodiment of the disclosure provides a current sampling circuit including a proportional current output circuit and a full differential common mode negative feedback circuit, specifically, the proportional current output circuit is configured to calculate a current output from a power device according to a preset proportion to obtain a first proportional current and a second proportional current, and to output the first proportional current and the second proportional current to the full differential common mode negative feedback circuit; and the full differential common mode negative feedback circuit is configured to shunt respectively the first proportional current and the second proportional current using a full differential common mode negative feedback network with a bias current in microamps to obtain a first sampling current and a second sampling current, and to output constantly the first sampling current and the second sampling current.

In the above solution, the power device may be implemented by a first Lateral Diffusion N-channel Metal-Oxide-Semiconductor (LDNMOS);

the proportional current output circuit may include a second LDNMOS, a third LDNMOS, a fourth LDNMOS and a fifth LDNMOS; and the full differential common mode negative feedback circuit may include a first P-channel Metal-Oxide-Semiconductor (PMOS), a second PMOS, a third PMOS, a fourth PMOS, a first resistor, a second resistor, a second reference current source, a third reference current source, a fourth reference current source, and a fifth reference current source.

In the above solution, in the proportional current output circuit, the drain of the second LDNMOS is connected with the drain of the fourth LDNMOS and a power supply, the gate of the second LDNMOS is connected with the gate of the first LDNMOS, the gate of the third LDNMOS and a gate driving voltage (hdrv_in from a gate driving circuit), the source of the second LDNMOS is connected respectively with the drain of the third LDNMOS and the drain of the fifth LDNMOS; the source of the third LDNMOS is connected respectively with the source of the first LDNMOS and a first end of the first reference current source; the gate of the fourth LDNMOS is connected with the gate of the fifth LDNMOS, the source of the fourth LDNMOS is connected respectively with the source of the first PMOS and the source of the third PMOS in the full differential common mode negative feedback circuit; the source of the fifth LDNMOS is connected respectively with the source of the second PMOS and the source of the fourth PMOS in the full differential common mode negative feedback circuit;

in the full differential common mode negative feedback circuit, the gate of the first PMOS is connected with the gate of the second PMOS, the drain of the first PMOS is connected respectively with a first end of the first resistor, the gate of the fourth PMOS and a first end of the third reference current source; the drain of the second PMOS is connected respectively with a first end of the second resistor, the gate of the third PMOS and a first end of the fourth reference current source; the drain of the third PMOS is connected with a first end of the second reference current source; the drain of the fourth PMOS is connected with the fifth reference current source; a second end of the first resistor is connected respectively with a second end of the second resistor, the gate of the first PMOS and the gate of the second PMOS; second ends of the first reference current source, the second reference current source, the third reference current source, the fourth reference current source and the fifth reference current source are all connected to a ground point; and the drain of the first LDNMOS is connected to the power supply.

Based on the above current sampling circuit, an embodiment of the disclosure further provides a current sampling method, and the method includes:

a current output from a power device is calculated according to a preset proportion to obtain a first proportional current and a second proportional current; and the first proportional current and the second proportional current are shunted respectively using a full differential common mode negative feedback network and a bias current in microamps to obtain a first sampling current and a second sampling current, and the first sampling current and the second sampling current are output constantly.

In the above solution, the step that a current output from a power device is calculated according to a preset proportion to obtain a first proportional current and a second proportional current may include:

a ratio between the current output from the power device and the preset proportion is calculated, and an obtained ratio is taken as a current value of a proportional branch;

the first proportional current and the second proportional current are determined according to the current value of the proportional branch.

In the above solution, the step that the first proportional current and the second proportional current are shunted respectively using a full differential common mode negative feedback network and a bias current in microamps to obtain a first sampling current and a second sampling current may include:

the first sampling current $I_{sense+}$ and the second sampling current $I_{sense-}$ are obtained from the following formula:

$$I_{sense+}=I_{J1}-I_b$$

$$I_{sense-}=I_{J2}-I_b$$

where $I_{J1}$ is the first proportional current, $I_{J2}$ is the second proportional current, and $I_b$ is the bias current in microamps provided by the full differential common mode negative feedback network.

Compared to the related arts, the current sampling circuit and method provided by the embodiments of the disclosure have the following advantages:

1) in the embodiments of the disclosure, a full differential common mode negative feedback circuit including four PMOSs and two resistors is used to replace a close loop negative feedback circuit including transistors and an operational amplifiers, in this way, it can be ensured that the full differential common mode negative feedback network has a gain larger than 60 dB, generally between 70 to 88 dB, and the higher the gain is, the more a stable sampling current output can be ensured, thereby implementing a stable sampling current out; in addition, the structure of the full differential common mode negative feedback circuit according to the embodiments of the disclosure is simpler when compared to that of the close loop negative feedback circuit in th related arts; and a sampling current output from the full differential common mode negative feedback circuit is only related to dimensions of a transistor and not affected by process variations, thus an accurate sampling current can be output;

2) compared to its counterparts in the related arts, the full differential common mode negative feedback circuit according to the embodiments of the disclosure has a higher integration density, occupies smaller pattern area and has lower cost; and 3) the full differential common mode negative feedback circuit according to the embodiments of the disclosure requires a smaller bias current that is in microamps and generally of 10-20 µA, thus its power consumption is reduced greatly.

DETAILED DESCRIPTION

During implementation of the present application, the applicant finds that current sampling schemes in related arts include at least the following disadvantages:

1) in the above current sampling circuit, in order to provide a main gain of the close loop negative feedback circuit, it is required to add an error amplifier or a adjustment transistor to the clamp of the operational amplifier, thus a close loop negative feedback circuit including the operational amplifier and the error amplifier or the adjustment transistor is intended to occupy too much pattern area, and required overheads of pattern area is higher, therefore, the above current sampling circuit is disadvantageous for applications in large-scale circuits having a high integration density; and 2) in the above current sampling circuit, the close loop negative feedback circuit requires large bias currents I1 and I2 in amps or milliamps, thus the above current sampling circuit consumes more power and is disadvantageous for the energy-saving development trend.

In an embodiment of the disclosure, a current output from a power device is calculated according to a preset proportion to obtain a first proportional current and a second proportional current; and the first proportional current and the second proportional current are shunted respectively using a full differential common mode negative feedback network and a bias current in microamps to obtain a first sampling current and a second sampling current, and the first sampling current and the second sampling current are output constantly.

Specific embodiments of the disclosure will be further elaborated below with reference to the drawings.

Figure 2:
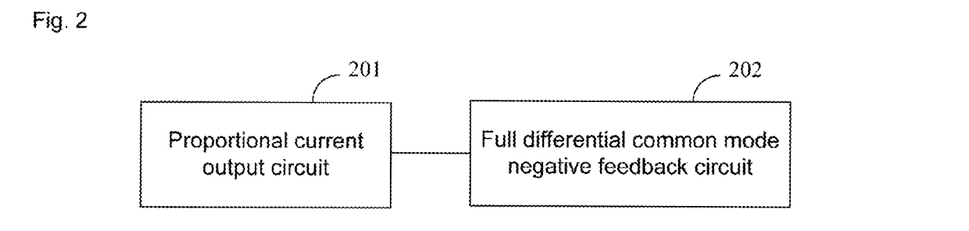
FIG. 2 is a schematic structural diagram of a current sampling circuit according to an embodiment of the disclosure.

An embodiment of the disclosure provides a current sampling circuit for sampling current of a power device, as shown in FIG. 2, the current sampling circuit includes a proportional current output circuit 201 and a full differential common mode negative feedback circuit 202, specifically, the proportional current output circuit 201 is configured to calculate a current output from a power device according to a preset proportion to obtain a proportional current, and to output the proportional current to the full differential common mode negative feedback circuit 202; and the full differential common mode negative feedback circuit 202 is configured to shunt respectively the first proportional current and the second proportional current using a full differential common mode negative feedback network with a bias current in microamps to obtain a first sampling current and a second sampling current, and to output constantly the first sampling current and the second sampling current.

Figure 3:
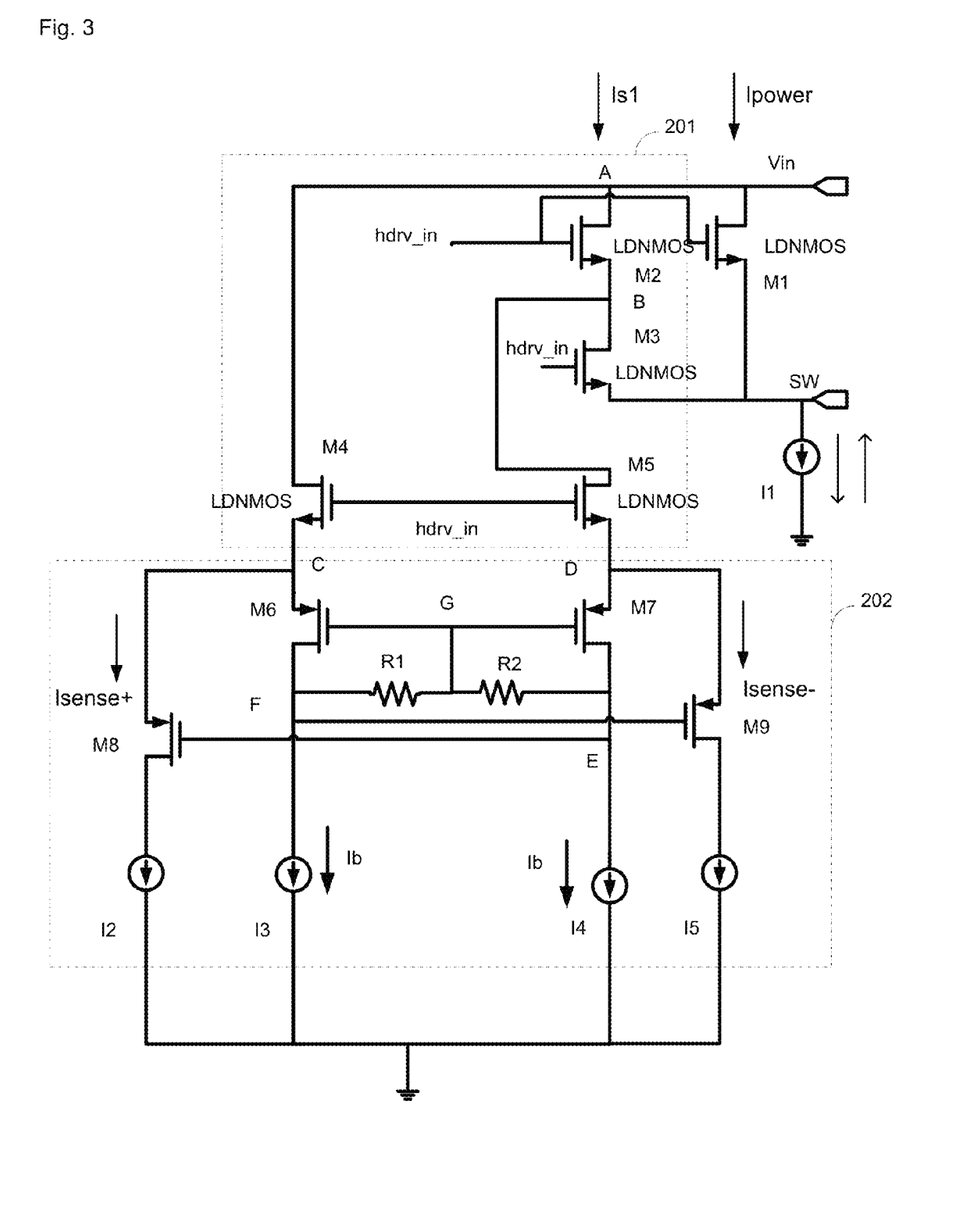
FIG. 3 is a schematic structural diagram of a current sampling circuit during practical application of an embodiment of the disclosure.

Herein, the power device may be implemented by a Negative channel Metal Oxide Semiconductor (NMOS), a Positive channel Metal Oxide Semiconductor (PMOS), a Lateral Diffusion NMOS (LDNMOS), a Lateral Diffusion PMOS (LDPMOS), and a PNP transistor or an NPN transistor that has power output function; preferably, the embodiment of the disclosure is implemented by an LDNMOS, and a first LDNMOS $M_1$ shown in FIG. 3 is namely a power device.

Specific structures of the proportional current output circuit 201 and of the full differential common mode negative feedback circuit 202 will be elaborated below based on the current sampling circuit shown in FIG. 3 from a practical application perspective.

the proportional current output circuit 201 includes a second LDNMOS $M_2$, a third LDNMOS $M_3$, a fourth LDNMOS $M_4$ and a fifth LDNMOS $M_5$; and The full differential common mode negative feedback circuit 202 includes a first
PMOS $M_6$, a second PMOS $M_7$, a third PMOS $M_8$, a fourth PMOS $M_9$, a first resistor $R_1$, a second resistor $R_2$, a second reference current source $I_2$, a third reference current source $I_3$, a fourth reference current source $I_4$, and a fifth reference current source $I_5$.

Herein transistors $M_2$, $M_3$, $M_4$, $M_5$ in the proportional current output circuit 201 are implemented by an LDMOS transistor of the same type as that of power transistor $M_1$, with a gate voltage being a gate driving voltage (hdrv_in output from a gate driving circuit), thus respective transistors operate in the linear region and are equivalent to resistors, and the maximum withstanding voltage of each of the transistors $M_1$, $M_2$, $M_3$, $M_4$, $M_5$ is 18V.

Herein transistors $M_6$, $M_7$, $M_8$, $M_9$ in the full differential common mode negative feedback circuit 202 are implemented by a PMOS transistor with a maximum withstanding voltage of 20V.

Herein transistors in the full differential common mode negative feedback circuit 203 can also be implemented, as required, by NMOS, NPN or PNP transistors.

Further, the connection relation of respective devices in the current sampling circuit according to the embodiment of the disclosure is elaborated with reference to FIG. 2.

in the proportional current output circuit 201, the drain of the second LDNMOS $M_2$ is connected with the drain of the fourth LDNMOS $M_4$ and a power supply $V_{in}$, the gate of the second LDNMOS $M_2$ is connected with the gate of the first LDNMOS $M_1$, the gate of the third LDNMOS and an output hdrv_in of a gate driving circuit (namely driven by a voltage signal output from the gate driving circuit), the source of the second LDNMOS $M_2$ is connected respectively with the drain of the third LDNMOS $M_3$ and the drain of the fifth LDNMOS $M_5$; the source of the third LDNMOS $M_3$ is connected respectively with the source of the first LDNMOS $M_1$ and one end of the first reference current source $I_1$; the gate of the fourth LDNMOS $M_4$ is connected with the gate of the fifth LDNMOS $M_5$, the source of the fourth LDNMOS $M_4$ is connected respectively with the source of the first PMOS $M_6$ and the source of the third PMOS $M_8$ in the full differential common mode negative feedback circuit 202; the source of the fifth LDNMOS $M_5$ is connected respectively with the source of the second PMOS $M_7$ and the source of the fourth PMOS $M_9$ in the full differential common mode negative feedback circuit 202;

in the full differential common mode negative feedback circuit 202, the gate of the first PMOS $M_6$ is connected with the gate of the second PMOS $M_7$, the drain of the first PMOS $M_6$ is connected with one end of the first resistor $R_1$, the gate of the fourth PMOS $M_9$ and one end of the third reference current source $I_3$; the drain of the second PMOS $M_7$ is connected with one end of the second resistor $R_2$, the gate of the third PMOS $M_8$ and one end of the fourth reference current source $I_4$; the drain of the third PMOS $M_8$ is connected with one end of the second reference current source $I_2$; the drain of the fourth PMOS $M_9$ is connected with the fifth reference current source $I_5$; the other end of the first resistor $R_1$ is connected respectively with the other end of the second resistor $R_2$, the gate of the first PMOS $M_6$ and the gate of the second PMOS $M_7$; the other ends of the first reference current source the second reference current source $I_2$, the third reference current source $I_3$, the fourth reference current source $I_4$ and the fifth reference current source $I_5$ are all connected to a ground point;

the drain of the first LDNMOS $M_1$ is connected to the power supply $V_{in}$.

In the embodiment of the disclosure, based on the above circuit structure and connection relation between devices, the operation principle of the current sampling circuit is as follows.

Firstly, the power device, i.e., a first LDNMOS $M_1$ outputs $I_{power}$ to the proportional current output circuit 201, the proportional current output circuit 201 calculates the output current $I_{power}$ according to a preset proportion to obtain a first proportional current and a second proportional current and outputs them to the full differential common mode negative feedback circuit 202.

Herein, the gate voltage of the transistors $M_1$, $M_2$, $M_3$, $M_4$, $M_5$ are driven by hdrv_in, thus these transistors operate in the linear region and are equivalent to resistors, and each of the transistors $M_1$, $M_2$, $M_3$, $M_4$, $M_5$ has a maximum withstanding voltage of 18 V since the voltage $V_{in}$ input by the power supply has a maximum value of 18 V.

Herein, the conductance of a transistor $$G = \mu \cdot C_{ox} \cdot \frac{W}{L}(V_{gs} - V_{th} - V_{ds}) \approx \frac{W}{L},$$

where $\mu \cdot C_{ox}$ is a constant factor of the transistor, $V_{gs}$ is a gate-source voltage of the transistor, $V_{th}$ is a threshold voltage of the transistor, $V_{ds}$ is a drain-source voltage of the transistor, W is the width of the channel, L is the length of the channel; since the conductance of the transistor $$G \approx \frac{W}{L},$$

the conductance G of the transistor can be adjusted by setting the width and the length of the channel of the transistor; in the embodiment of the disclosure, for conductance of $M_1$, $M_2$, $M_3$, $M_4$, $M_5$, it is preset that $G_1 = X \times G_2 = X \times G_3$; $G_2 = G_3 = Y \times G_4 = Y \times G_5$, where X and Y are preset constants of proportionality.

Specifically, the proportional current output circuit 201 firstly calculates the output current $I_{power}$ according to the preset proportion to obtain:

$$I_{power}/I_{s1} = \left(\frac{1}{G_2} + \frac{1}{G_3}\right)/\left(\frac{1}{G_1}\right) = 2X \tag{1}$$

where $I_{s1}$ is the value of current flowing through the transistor $M_2$, and $\frac{1}{G_1}, \frac{1}{G_2}, \frac{1}{G_3}$ are resistances of the transistors $M_1$, $M_2$, $M_3$ respectively;

then the obtained current $I_{s1}$ is output to drains of transistors $M_3$, $M_5$ so as to obtain a first proportional current $I_{J1}$ flowing through the transistor $M_4$ and a second proportional current $I_{J2}$ flowing through the transistor $M_5$, the first proportional current $I_{J1}$ is output to sources of the transistors $M_6$ and $M_8$ in the full differential common mode negative feedback circuit 202, and the second proportional current $I_{J2}$ is output to sources of the transistors $M_7$ and $M_9$ in the full differential common mode negative feedback circuit 202; the transistors $M_4$ and $M_5$ have an effect of isolating a high voltage, thus it is possible to prevent breakdown of the full differential common mode negative circuit 202 by the high voltage.

Finally, the full differential common mode negative feedback circuit 202 is in the form of a full differential common mode negative feedback network consisting of transistors $M_6$, $M_7$, $M_8$, $M_9$, resistors $R_1$, $R_2$, the second reference current source $I_2$, a third reference current source $I_3$, a fourth reference current source $I_4$, and a fifth reference current source $I_5$, and the third reference current source and the fourth reference current source are used to provide the full differential common mode negative feedback network with a bias current $I_b$ in microamps; the first proportional current $I_{J1}$ and the second proportional current $I_{J2}$ are shunted respectively to obtain a first sampling current $I_{sense+}$ and a second sampling current $I_{sense-}$.

where $I_{J1}=I_{sense+}+I_3$, $I_{J2}=I_{sense-}+I_4$, $I_{sense+}$ is a current flowing through the transistor $M_8$, $I_{sense-}$ is a current flowing through the transistor $M_9$, $I_3$ is a current flowing through the third reference current source, $I_4$ is a current flowing through the fourth reference current source, and $I_3=I_4=I_b$, where $I_b$ is a benchmark bias current providing the transistors $M_6$, $M_7$ with a quiescent operating point and as low as 10 to 20 µA, thus compared to the current sampling circuit in related arts, the current sampling circuit according to the embodiment of the disclosure has a greatly-reduced power consumption.

Figure 4:
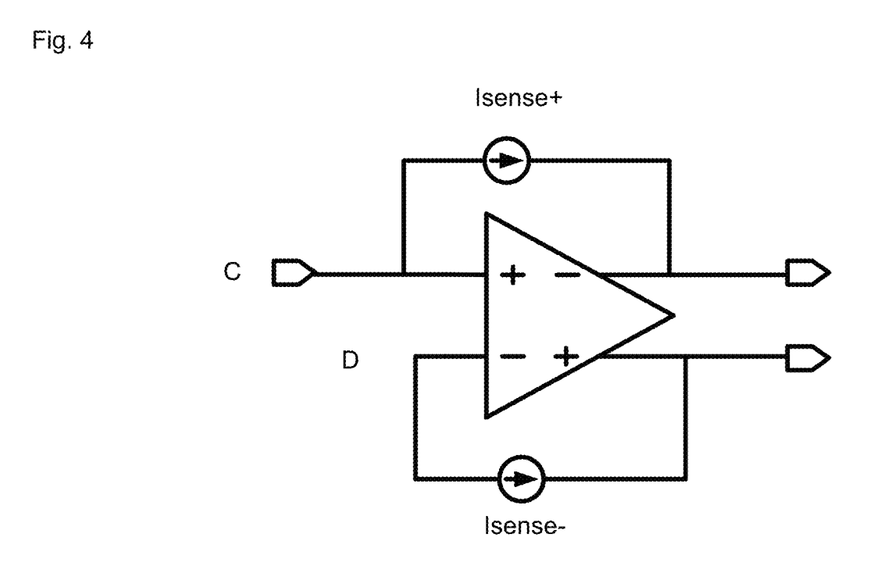
FIG. 4 is an equivalent structural diagram of a full differential common mode negative feedback network according to an embodiment of the disclosure.

In above embodiments of the disclosure, the full differential common mode negative feedback network is equivalent to a negative feedback network including an operational amplifier, as shown in FIG. 4; wherein a circuit consisting of transistors $M_6$, $M_7$ and resistors $R_1$, $R_2$ is equivalent to an operational amplifier, points C and D are taken as inputs of the operational amplifier, and the two sampling currents are taken approximately as being connected to the input and output of the operational amplifier. Due to the clamping effect of the operational amplifier, its inputs C and D have a same voltage, the first sampling current $I_{sense+}$ from the output is fed back to the input C of the operational amplifier via the transistor $M_8$, the second sampling current $I_{sense-}$ from the output is fed back to the input D of the operational amplifier via the transistor $M_9$, thus an effect of an operational amplifier feedback network is resulted, and it is possible to provide the current sampling circuit with a stable gain, therefore, the current sampling circuit according to the embodiment of the disclosure occupies smaller pattern area, has a higher integration density and lower cost.

Herein, when a current flowing through the transistor $M_1$ is downwards, a forward first sampling current $I_{sense+}$+ will flow through a branch where the transistor $M_8$ is located, and a reverse second sampling current $I_{sense-}$ of 0 will flow through the transistor $M_9$; on the contrary, when the current flowing through the transistor $M_1$ is upwards (i.e., reverse), the forward first sampling current of 0 will flow through the branch where the transistor $M_8$ is located, and the reverse second sampling current $I_{sense-}$ will flow through the transistor $M_9$, and $I_{sense+}=I_{sense-}$, thus two branches operate separately and there is no interference therebetween, thereby implementing current sampling in both directions.

How to obtain the forward first sampling current $I_{sense+}$ in an embodiment of the disclosure will be elaborated below by taking current sampling in a forward direction as an example, KVL (Kirchhoff's Voltage Law) equations obtained from point A to point G are as follows.

$$I_{J1} * \left(\frac{1}{G_4}\right) + V_{sg6} = I_{s1} * \left(\frac{1}{G_2}\right) + I_b\left(\frac{1}{G_5}\right) + V_{sg7} \qquad (2)$$

$$V_{sg6} = V_{sg7} \qquad (3)$$

$$I_{J1} = I_b + I_{sense+} \qquad (4)$$

where $V_{sg6}$ is a gate-source voltage of the transistor $M_6$, $V_{sg7}$ is a gate-source voltage of the transistor $M_7$; it can be obtained from equations (1), (2), (3) and (4):

$$I_{sense+} = I_{s1} * \left(\frac{G_4}{G_2}\right) = I_{s1}/Y = I_{power}/(2XY);$$

it can be seen that the first sampling current $I_{sense+}$ in the embodiment of the disclosure is only related to the width and length of a transistor and not affected by process variations, thus a sampling current with improved accuracy can be obtained.

In the embodiment of the disclosure, the method for calculating the reverse second sampling current $I_{sense-}$ is similar to the method for calculating the forward first sampling current $I_{sense+}$; and the reverse second sampling current is equal to the forward first sampling current, i.e., the second sampling current $I_{sense-}=I_{power}/(2XY)$, thus duplicated content thereof will be omitted.

In practical applications, the proportional current output circuit 201 and the full differential common mode negative feedback circuit 202 can be applied to a charger chip of a power supply management chip.

Figure 5:
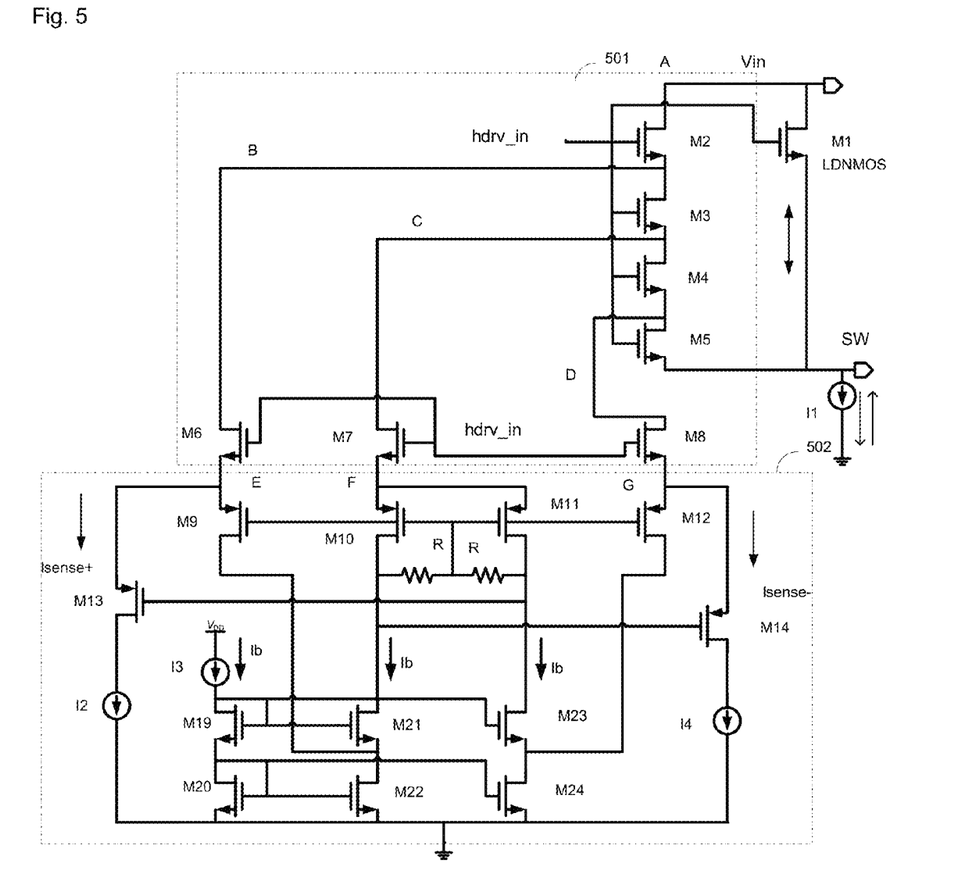
FIG. 5 is a schematic structural diagram of a folding current sampling circuit according to an embodiment of the disclosure.

The current sampling circuit in the embodiment of the disclosure can also be of a folding structure, the folding current sampling circuit has a similar principle as that of the above current sampling circuit, and it has flexible applications, as shown in FIG. 5, the current sampling circuit includes a proportional current output circuit 501 and a full differential common mode negative feedback circuit 502;

specifically, the proportional current output circuit 501 includes a second LDNMOS $M_2$, a third LDNMOS $M_3$, a fourth LDNMOS $M_4$, a fifth LDNMOS $M_5$, a sixth LDNMOS $M_6$, a seventh LDNMOS $M_7$, and a eighth LDNMOS $M_8$;

the full differential common mode negative feedback circuit 502 includes a first PMOS $M_9$, a second PMOS $M_{10}$, a third PMOS $M_{11}$, a fourth PMOS $M_{12}$, a fifth PMOS $M_{13}$, a sixth PMOS $M_{14}$, a first resistor $R_1$, a second resistor $R_2$, a second reference current source $I_2$, a third reference current source $I_3$, a fourth reference current source $I_4$, a ninth NMOS $M_{19}$, a tenth NMOS $M_{20}$, a eleventh NMOS $M_{21}$, a twelfth NMOS $M_{22}$, a thirteenth NMOS $M_{23}$, and a fourteenth NMOS $M_{24}$;

Herein, transistors $M_2$, $M_3$, $M_4$, $M_5$, $M_6$, $M_7$, $M_8$ in the proportional current output circuit 201 are implemented by an LDMOS transistor of the same type as that of power transistor $M_1$, with a gate voltage being a gate driving voltage hdrv_in, thus respective transistors operate in the linear region and are equivalent to resistors, and each of the transistors is implemented by a transistor with the maximum withstanding voltage of 18 V.

Herein, voltages of transistors $M_9$, $M_{10}$, $M_{11}$, $M_{12}$, $M_{13}$, $M_{14}$ in the full differential common mode negative feedback circuit are all maintained at a voltage of 20 V; voltages of transistors $M_{19}$, $M_{20}$, $M_{21}$, $M_{22}$, $M_{23}$, $M_{24}$ can be adjusted appropriately to ensure a benchmark bias current $I_b$ desired in the full differential common mode negative feedback circuit 502, and the benchmark bias current $I_b$ providing $M_{10}$, $M_{11}$ with a quiescent operating point is as low as 10 to 20 μA.

Herein, transistors in the full differential common mode negative feedback circuit 502 can also be implemented, as required, by NMOS, NPN or PNP transistors.

The connection relation of respective devices in the folding current sampling circuit according to the embodiment of the disclosure is elaborated below with reference to FIG. 5.

in the proportional current output circuit 501, the drain of the transistor $M_2$ is connected with a power supply $V_{in}$, the gate of the transistor $M_2$ is connected with the gate of the transistor $M_1$, the gate of the transistor $M_3$, the gate of the transistor $M_4$, the gate of the transistor $M_5$ and a driving voltage hdrv_in, the source of the transistor $M_2$ is connected with the drain of the transistor $M_3$ and the drain of the transistor $M_6$ in a current mirror circuit 502; the source of the transistor $M_3$ is connected with the source of the transistor $M_4$ and one end of the first reference current source $I_1$; the gate of the transistor $M_6$ is connected with the gate of the transistor $M_7$ and the gate of transistor $M_8$, the source of the transistor $M_6$ is connected with the source of the transistor $M_9$ and the source of the transistor $M_{13}$ in the full differential common mode negative feedback circuit 502; the source of the transistor $M_7$ is connected with the source of the transistor $M_{10}$ and the source of the transistor $M_{11}$ in the full differential common mode negative feedback circuit 502; the source of the transistor $M_8$ is connected with the source of the transistor $M_{12}$ and the source of the transistor $M_{14}$ in the full differential common mode negative feedback circuit 502;

in the full differential common mode negative feedback circuit 502, the drain of the transistor $M_9$ is connected with the source of the transistor $M_{21}$ and the drain of the transistor $M_{22}$, the gate of the transistor $M_9$ is connected with the gate of the transistor $M_{10}$, the gate of the transistor $M_{11}$ and the gate of the transistor $M_{12}$; the drain of the transistor $M_{10}$ is connected with the resistor $R_1$ and the drain of the transistor $M_{21}$; the drain of the transistor $M_{11}$ is connected with the resistor $R_2$ and the drain of the transistor $M_{23}$; the drain of the transistor $M_{12}$ is connected with the source of the transistor $M_{23}$ and the drain of the transistor $M_{24}$; the drain of the transistor $M_{13}$ is connected with one end of the second reference current source $I_2$; the drain of the transistor $M_{14}$ is connected with one end of the fourth reference current source $I_4$, the gate of the transistor $M_{13}$ is connected with the drain of the transistor $M_{21}$; the gate of the transistor $M_{19}$ is connected with the gate of the transistor $M_{21}$, the drain of the transistor $M_{19}$ is connected with the gate of the transistor $M_{21}$, the gate of the transistor $M_{23}$ and one end of the third reference current source $I_3$, the drain of the transistor $M_{19}$ is connected with the drain of the transistor $M_{20}$, the gate of the transistor $M_{22}$ and the gate of the transistor $M_{24}$; the source of the transistor $M_{20}$ is connected to the a ground point, the gate of the transistor $M_{20}$ is connected with the gate of the transistor $M_{22}$ and the gate of the transistor $M_{24}$; the source of the transistor $M_{21}$ is connected with the drain of the transistor $M_9$ and the drain of the transistor $M_{22}$; the source of the transistor $M_{22}$ is connected to the ground point; the source of the transistor $M_{23}$ is connected with the drain of the transistor $M_{12}$ and the drain of the transistor $M_{24}$; the source of the transistor $M_{24}$ is connected to the ground point; other ends of the first reference current source $I_1$, the second reference current source $I_2$, and the fourth reference current $I_4$ source are connected to the ground point; the other end of the third reference current source $I_3$ is connected with the power supply $V_{DD}$;

the drain of the transistor $M_1$ is connected to the power supply

In the above embodiment of the disclosure, the current of the transistor $M_1$ in the folding current sampling circuit is scaled twice through the proportional current output circuit 501, the output current becomes smaller than that of the above current sampling circuit, thus the power consumption is lowered further; the transistors $M_{10}$, $M_{11}$, $M_{13}$, $M_{14}$, the first resistor $R_1$ and the second resistor constitute a full differential common mode negative feedback network; the transistors $M_9$, $M_{20}$, $M_{21}$, $M_{22}$, $M_{23}$, $M_{24}$ constitute a folding structure, and the folding current sampling circuit according to the embodiment of the disclosure can meet application demand in low voltage field.

In the embodiments of the disclosure, current sampling circuits shown in FIG. 2, 3 or 5 can be applied in devices or apparatuses that need current sampling.

Based on same technical ideas, an embodiment of the disclosure further provides a current sampling method, since the principle of the method is similar to that of the current sampling circuit, for the implementation of the method and its principle, please refer to the implementation of the circuit and its corresponding principle, and duplicated content thereof will be omitted.

Figure 6:
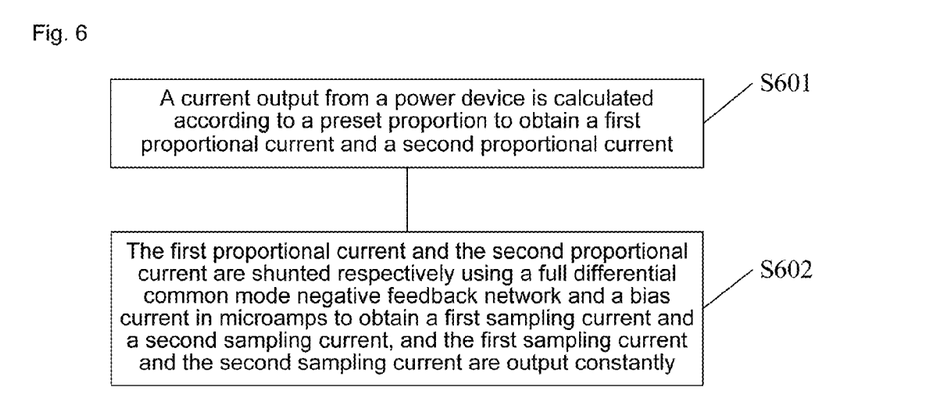
FIG. 6 is a flow chart of a current sampling method according to an embodiment of the disclosure.

As shown in FIG. 6, the current sampling method provided by the embodiment of the disclosure includes:

step S601, a current output from a power device is calculated according to a preset proportion to obtain a first proportional current and a second proportional current;

specifically, firstly, a ratio between the current output from the power device and the preset proportion is calculated according to $I_{s1}=I_{power}/2X$, and an obtained ratio is taken as a current value of a proportional branch; then the first proportional and the second proportional current are determined according to the current value of the proportional branch;

where $I_{power}$ is the current output from the power device; $I_{s1}$ is the current value of the proportional branch, and 2X is the preset proportion.

Step S602, the first proportional current and the second proportional current are shunted respectively using a full differential common mode negative feedback network and a bias current in microamps to obtain a first sampling current and a second sampling current, and the first sampling current and the second sampling current are output constantly.

Specifically, the first sampling current $I_{sense+}$ and the second sampling current $I_{sense-}$ obtained from the following formula:

$$I_{sense+}=I_{J1}-I_b$$

$$I_{sense-}=I_{J2}-I_b$$

where $I_{J1}$ is the first proportional current, $I_{J2}$ is the second proportional current, and $I_b$ is the bias current in microamps provided by the full differential common mode negative feedback network.

Although only preferable embodiments of the disclosure are described, once those skilled in the art know the basic inventive concept, they can make other modifications and changes to these embodiments. Thus the accompanying claims are intended to include preferable embodiments and all changes and modifications within the scope of protection of the disclosure.

It is obvious that various changes and variations can be made by those skilled in the art without departing from the spirit and scope of the disclosure. In this way, if these modifications and variations fall within the scope of the claims and equivalent techniques, the disclosure is intended to include these changes and variations.

The invention claimed is:

1. A current sampling circuit, comprising: a proportional current output circuit and a full differential common mode negative feedback circuit, the proportional current output circuit is configured to calculate a current output from a power device according to a preset proportion to obtain a first proportional current and a second proportional current, and to output the first proportional current and the second proportional current to the full differential common mode negative feedback circuit; and the full differential common mode negative feedback circuit is configured to shunt respectively the first proportional current and the second proportional current using a full differential common mode negative feedback network and a bias current in microamps to obtain a first sampling current and a second sampling current, and to output constantly the first sampling current and the second sampling current; and wherein the power device is implemented by a first Lateral Diffusion N-channel Metal-Oxide-Semiconductor (LDNMOS);

the proportional current output circuit comprises a second LDNMOS, a third LDNMOS, a fourth LDNMOS and a fifth LDNMOS; and the full differential common mode negative feedback circuit comprises a first P-channel Metal-Oxide-Semiconductor (PMOS), a second PMOS, a third PMOS, a fourth PMOS, a first resistor, a second resistor, a second reference current source, a third reference current source, a fourth reference current source, and a fifth reference current source; and wherein in the proportional current output circuit, the drain of the second LDNMOS is connected with the drain of the fourth LDNMOS and a power supply, the gate of the second LDNMOS is connected with the gate of the first LDNMOS, the gate of the third LDNMOS and a gate driving voltage, the source of the second LDNMOS is connected respectively with the drain of the third LDNMOS and the drain of the fifth LDNMOS; the source of the third LDNMOS is connected respectively with the source of the first LDNMOS and a first end of the first reference current source; the gate of the fourth LDNMOS is connected with the gate of the fifth LDNMOS, the source of the fourth LDNMOS is connected respectively with the source of the first PMOS and the source of the third PMOS in the full differential common mode negative feedback circuit;

the source of the fifth LDNMOS is connected respectively with the source of the second PMOS and the source of the fourth PMOS in the full differential common mode negative feedback circuit;

in the full differential common mode negative feedback circuit, the gate of the first PMOS is connected with the gate of the second PMOS, the drain of the first PMOS is connected respectively with a first end of the first resistor, the gate of the fourth PMOS and a first end of the third reference current source; the drain of the second PMOS is connected respectively with a first end of the second resistor, the gate of the third PMOS and a first end of the fourth reference current source; the drain of the third PMOS is connected with a first end of the second reference current source; the drain of the fourth PMOS is connected with the fifth reference current source; a second end of the first resistor is connected respectively with a second end of the second resistor, the gate of the first PMOS and the gate of the second PMOS; second ends of the first reference current source, the second reference current source, the third reference current source, the fourth reference current source and the fifth reference current source are all connected to a ground point; and the drain of the first LDNMOS is connected to the power supply.

2. A current sampling method, comprising:

calculating a current output from a power device according to a preset proportion to obtain a first proportional current and a second proportional current; and shunting respectively the first proportional current and the second proportional current using a full differential common mode negative feedback network with a bias current in microamps to obtain a first sampling current and a second sampling current, and outputting constantly the first sampling current and the second sampling current;

wherein the shunting respectively the first proportional current and the second proportional current using a full differential common mode negative feedback network with a bias current in microamps to obtain a first sampling current and a second sampling current comprises:

obtaining the first sampling current $I_{sense+}$ and the second sampling current $I_{sense-}$ from the following formula:

$$I_{sense+} = I_{J1} - I_b$$

$$I_{sense-} = I_{J2} - I_{b-}$$

where $I_{J1}$ is the first proportional current, $I_{J2}$ is the second proportional current, and $I_b$ is the bias current in microamps provided by the full differential common mode negative feedback network.

3. The current sampling method according to claim 2, wherein the calculating a current output from a power device according to a preset proportion to obtain a first proportional current and a second proportional current comprises:

calculating a ratio between the current output from the power device and the preset proportion, and taking an obtained ratio as a current value of a proportional branch;

determining the first proportional current and the second proportional current according to the current value of the proportional branch.

* * * * *